(12) United States Patent
Mu et al.

(10) Patent No.: US 9,142,315 B2
(45) Date of Patent: Sep. 22, 2015

(54) METHODS AND SYSTEMS FOR ADJUSTING NVM CELL BIAS CONDITIONS FOR READ/VERIFY OPERATIONS TO COMPENSATE FOR PERFORMANCE DEGRADATION

(75) Inventors: Fuchen Mu, Austin, TX (US);
Benjamin A. Schmid, Austin, TX (US);
Yanzhuo Wang, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 116 days.

(21) Appl. No.: 13/557,449

(22) Filed: Jul. 25, 2012

(65) Prior Publication Data

US 2014/0029350 A1    Jan. 30, 2014

(51) Int. Cl.
*G11C 11/34* (2006.01)
*G11C 16/34* (2006.01)
*G11C 11/56* (2006.01)
*G11C 16/04* (2006.01)

(52) U.S. Cl.
CPC ........ *G11C 16/3495* (2013.01); *G11C 11/5621* (2013.01); *G11C 16/0483* (2013.01)

(58) Field of Classification Search
CPC ........... G11C 16/3495; G11C 16/0483; G11C 11/5621
USPC ............. 365/185.22, 185.03, 185.18, 185.33, 365/185.19
See application file for complete search history.

(56) References Cited

U.S. PATENT DOCUMENTS

| | | | |
|---|---|---|---|
| 5,991,201 A | 11/1999 | Kuo et al. | 365/185.19 |
| 6,944,077 B2 | 9/2005 | Morikawa | 365/204 |
| 7,079,424 B1 | 7/2006 | Lee et al. | 365/185.29 |
| 7,173,859 B2 | 2/2007 | Hemink | 365/185.28 |
| 7,177,199 B2 | 2/2007 | Chen et al. | 365/185.28 |
| 7,224,617 B2 | 5/2007 | Takeuchi | |
| 7,580,288 B2 | 8/2009 | Choy et al. | |
| 7,633,807 B2 | 12/2009 | Chen et al. | |
| 7,715,237 B2 | 5/2010 | Cohen | 365/185.2 |
| 7,733,700 B2 | 6/2010 | Wang | 365/185.18 |
| 7,864,588 B2 | 1/2011 | Betser et al. | 365/185.2 |
| 7,877,542 B2 | 1/2011 | Chow et al. | 711/103 |
| 8,087,787 B2 | 1/2012 | Medin | 353/52 |
| 8,102,713 B2 | 1/2012 | Teggatz et al. | 365/185.18 |

(Continued)

OTHER PUBLICATIONS

Mu et al., "Methods and Systems for Adjusting NVM Cell Bias Conditions for Program/Erase Operations to Reduce Performance Degradation", U.S. Appl. No. 13/557,629, filed Jul. 25, 2012, 30 pgs.

(Continued)

*Primary Examiner* — Richard Elms
*Assistant Examiner* — Mohammed A Bashar
(74) *Attorney, Agent, or Firm* — Egan, Peterman & Enders LLP.

(57) ABSTRACT

Methods and systems are disclosed for adjusting read/verify bias conditions for non-volatile memory (NVM) cells to improve performance and product lifetime of NVM systems. System embodiments include integrated NVM systems having a NVM controller, a bias voltage generator, and an NVM cell array. Further, the NVM systems can store performance degradation information and read/verify bias condition information within storage circuitry. The disclosed embodiments adjust read/verify bias conditions for the NVM cells based upon performance degradation determinations, for example, temperature-based performance degradation determinations.

18 Claims, 5 Drawing Sheets

(56) References Cited

U.S. PATENT DOCUMENTS

| | | | |
|---|---|---|---|
| 2003/0147278 A1 | 8/2003 | Tanaka et al. | |
| 2004/0145947 A1* | 7/2004 | Micheloni et al. | 365/185.19 |
| 2007/0171726 A1* | 7/2007 | Kang et al. | 365/185.22 |
| 2007/0183210 A1* | 8/2007 | Choi et al. | 365/185.22 |
| 2007/0195603 A1 | 8/2007 | Aritome et al. | |
| 2008/0117688 A1* | 5/2008 | Park et al. | 365/185.22 |
| 2008/0159007 A1 | 7/2008 | Sekar et al. | |
| 2010/0074028 A1 | 3/2010 | Hirose et al. | |
| 2011/0182119 A1 | 7/2011 | Strasser et al. | |
| 2011/0205823 A1* | 8/2011 | Hemink et al. | 365/211 |
| 2013/0132670 A1* | 5/2013 | Nishikawa et al. | 711/114 |
| 2014/0029350 A1 | 1/2014 | Mu et al. | |
| 2014/0029351 A1* | 1/2014 | Mu et al. | 365/185.22 |

OTHER PUBLICATIONS

Mu et al., "Methods and Systems for Adjusting NVM Cell Bias Conditions Based Upon Operating Temperature to Reduce Performance Degradation", U.S. Appl. No. 13/557,481, filed Jul. 25, 2012, 20 pgs.

Stephen Ledford, "Non-Volatile Memory Technology Overview," Freescale Semiconductor, AN1837, 2004; 28 pgs.

U.S. Appl. No. 13/169,989, "Adaptive Write Procedures for Non-Volatile Memory Using Verify Read," filed Jun. 27, 2011; 29 pgs.

Choy et al, U.S. Appl. No. 13/023,713, "Erase Ramp Pulse Width Control for Non-Volatile Memory," filed Feb. 9, 2011; 27 pgs.

Foreign Search Report, Application No. 13177161.0, Nov. 18, 2013, 6 pgs.

European Search Report, Aug. 26, 2014, 13 pgs.

Notice of Allowance dated Sep. 1, 2014, for Mu et al., "Methods and Systems for Adjusting NVM Cell Bias Conditions for Program/Erase Operations to Reduce Performance Degradation", U.S. Appl. No. 13/557,629, filed Jul. 25, 2012, 7 pgs.

Office Action dated Apr. 24, 2014, for Mu et al., "Methods and Systems for Adjusting NVM Cell Bias Conditions for Programs/ Erase Operations to Reduce Performance Degradation", U.S. Appl. No. 13/557,629, filed Jul. 25, 2012, 19 pgs.

Response submitted Jul. 8, 2014, for Mu et al., "Methods and Systems for Adjusting NVM Cell Bias Conditions for Programs/Erase Operations to Reduce Performance Degradation", U.S. Appl. No. 13/557,629, filed Jul. 25, 2012, 19 pgs.

Preliminary Amendment submitted May 15, 2014, for Mu et al., "Methods and Systems for Adjusting NVM Cell Bias Conditions Based Upon Operating Temperature to Reduce Performance Degradation", U.S. Appl. No. 13/557,481, filed Jul. 25, 2012, 5 pgs.

Notice of Allowance dated Jun. 22, 2014, for Mu et al., "Methods and Systems for Adjusting NVM Cell Bias Conditions Based Upon Operating Temperature to Reduce Performance Degradation", U.S. Appl. No. 13/557,481, filed Jul. 25, 2012, 12 pgs.

\* cited by examiner

METHODS AND SYSTEMS FOR ADJUSTING NVM CELL BIAS CONDITIONS FOR READ/VERIFY OPERATIONS TO COMPENSATE FOR PERFORMANCE DEGRADATION

RELATED APPLICATIONS

This application is related in subject matter to the following concurrently filed applications: U.S. patent application Ser. No. 13/557,481, entitled "METHODS AND SYSTEMS FOR ADJUSTING NVM CELL BIAS CONDITIONS BASED UPON OPERATING TEMPERATURE TO REDUCE PERFORMANCE DEGRADATION," and U.S. patent application Ser. No. 13/557,629, entitled "METHODS AND SYSTEMS FOR ADJUSTING NVM CELL BIAS CONDITIONS FOR PROGRAM/ERASE OPERATIONS TO REDUCE PERFORMANCE DEGRADATION," and which are each hereby incorporated by reference in its entirety.

TECHNICAL FIELD

This technical field relates to non-volatile memories (NVMs) and, more particularly, to techniques for controlling memory operations for NVM cells.

BACKGROUND

Programmable memories have been implemented using non-volatile memory (NVM) cells. These NVM systems can be implemented as stand-alone memory integrated circuits or can be embedded within other integrated circuits. NVM systems have utilized a variety of cell structures for NVM cells, including floating gate cells and split-gate cells. Further, a variety of techniques have been used to perform read, program, and erase operations for NVM cells, including Fowler-Nordheim (FN) tunneling techniques. The performance of NVM cells can degrade, however, due to a variety of factors.

Cycling performance for NVM cells, for example, is temperature dependent. In particular, the speed of program operations is slower at higher temperature than that at lower temperature. Fowler-Nordheim (FN) tunneling erase operations are faster at high temperature than that at lower temperature. These temperature variations are natural behaviors based on physical properties. These temperature dependent behaviors can lead to performance degradation. For example, a voltage ramp is often used in FN erase and soft-program operations. For the slow erase operations at lower temperatures, the time needed for the erase operation can run over the voltage ramp timing, thereby leading to dramatically degraded cycling performance.

Cycling performance for NVM cells will also degrade dramatically after a certain number of cycles because of the accumulation of the damage due to cycling. For example, for NVM cells that utilize floating gates and tunneling oxides, more and more charges (e.g., holes and electrons) are trapped within tunnel oxide as cycle count increases, thereby damaging the tunnel oxide. This damage not only degrades cycling performance, but it also degrades other reliability aspects for the NVM cells due to large de-trapping effects. Some of these reliability aspects include data retention bake (DRB) reliability, operating life (OL), program disturb, read disturb, and other reliability aspects for the NVM cells.

Performance degradations for the NVM cells, such as performance degradations due to temperature variations or high cycle counts, can reduce the useful lifetime for the NVM systems and integrated circuits within which these NVM systems are embedded.

DESCRIPTION OF THE DRAWINGS

It is noted that the appended figures illustrate only example embodiments and are, therefore, not to be considered as limiting the scope of the present invention. Elements in the figures are illustrated for simplicity and clarity and have not necessarily been drawn to scale

DETAILED DESCRIPTION

Methods and systems are disclosed for adjusting bias conditions for non-volatile memory (NVM) cells to improve performance and product lifetime of NVM systems. In particular, embodiments are disclosed for adjusting NVM cell bias conditions for read (including verify read) operations based upon performance degradation determinations including temperature-based performance degradation determinations. The disclosed embodiments maintain high performance even as performance degradation occurs, for example, due to operating temperature variations or high cycle counts, thereby improving product reliability and extending product lifetime. The various embodiments disclosed can be used alone or in combination with each other, as desired. Further, additional or different features and variations can be implemented, as desired, and related or modified systems and methods can be utilized, as well.

Figure 1:
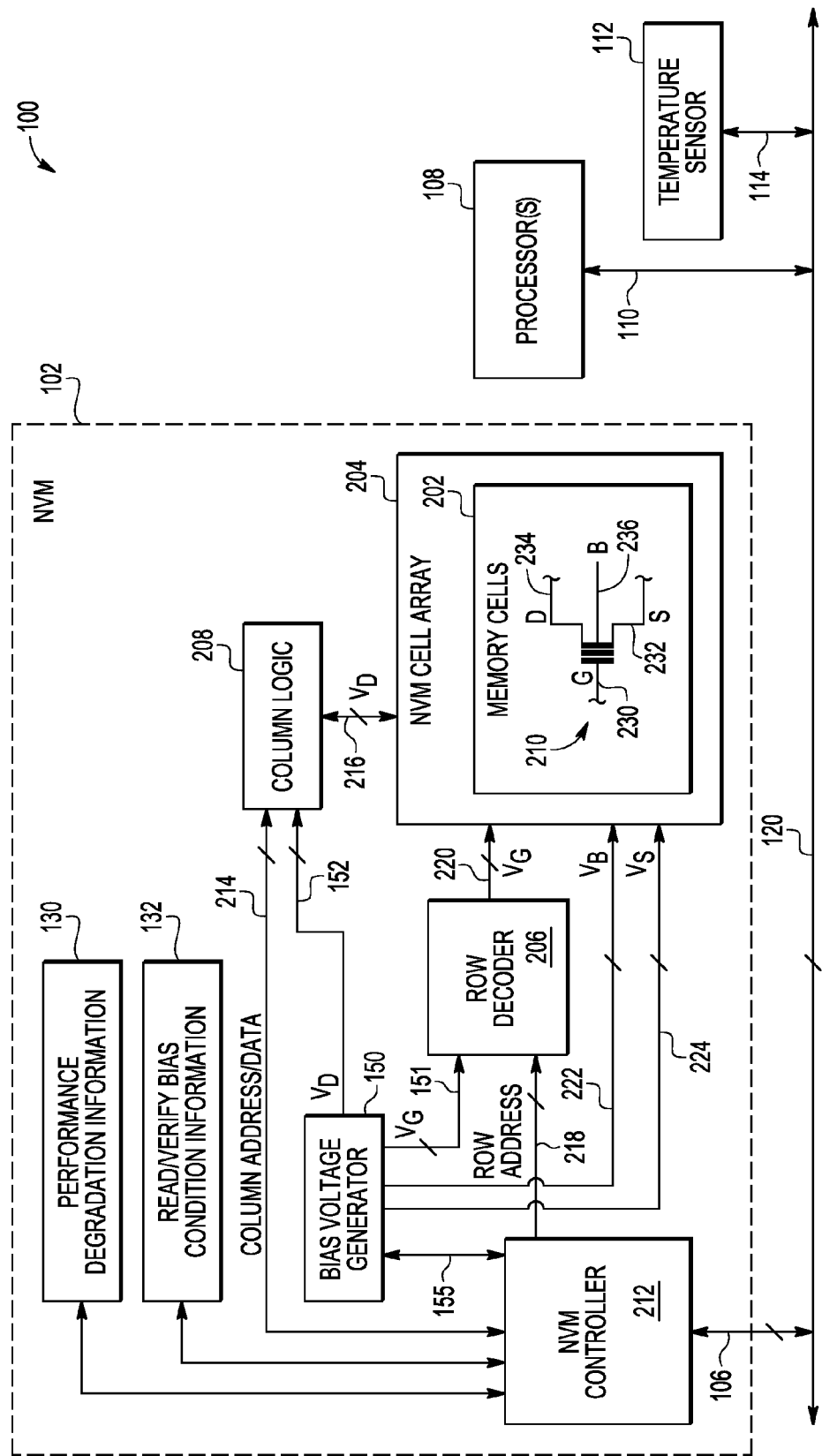
FIG. 1 is a block diagram of an embodiment including an non-volatile memory (NVM) system.
Figure 2:
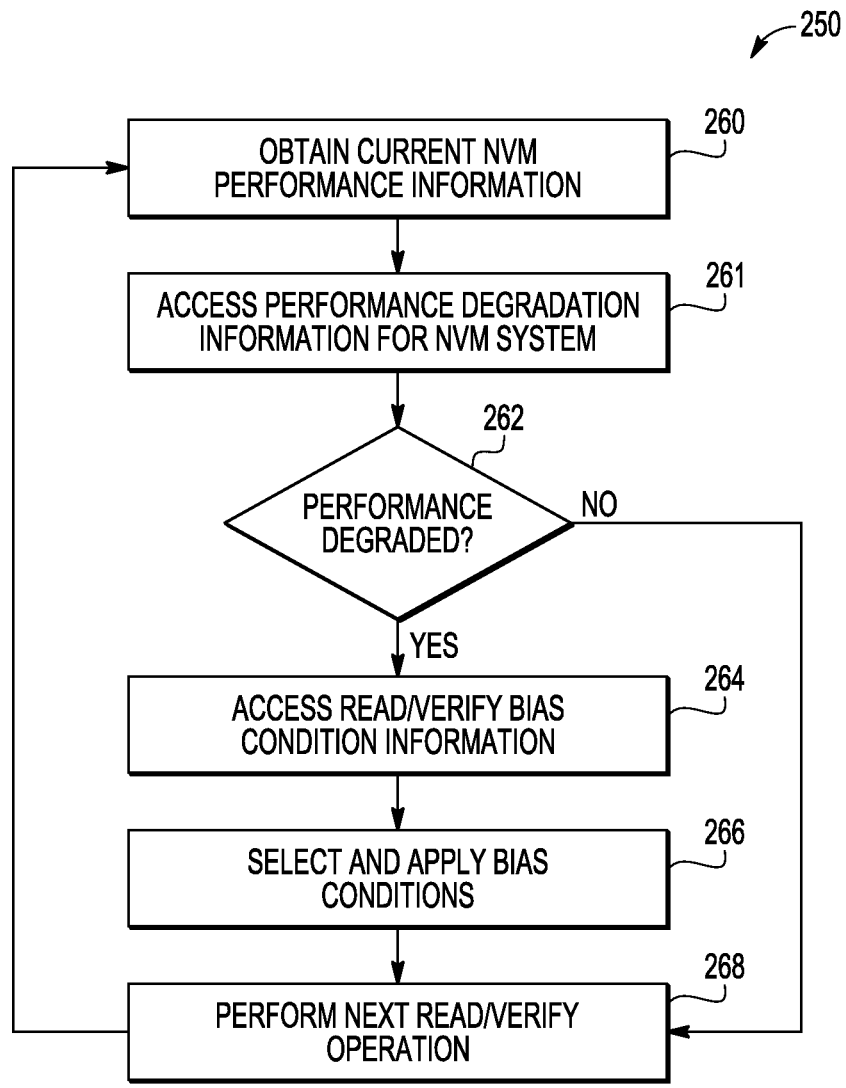
FIG. 2 is a flow diagram of an embodiment for adjusting operating bias conditions for the NVM system when performance degradation has been detected.
Figure 3:
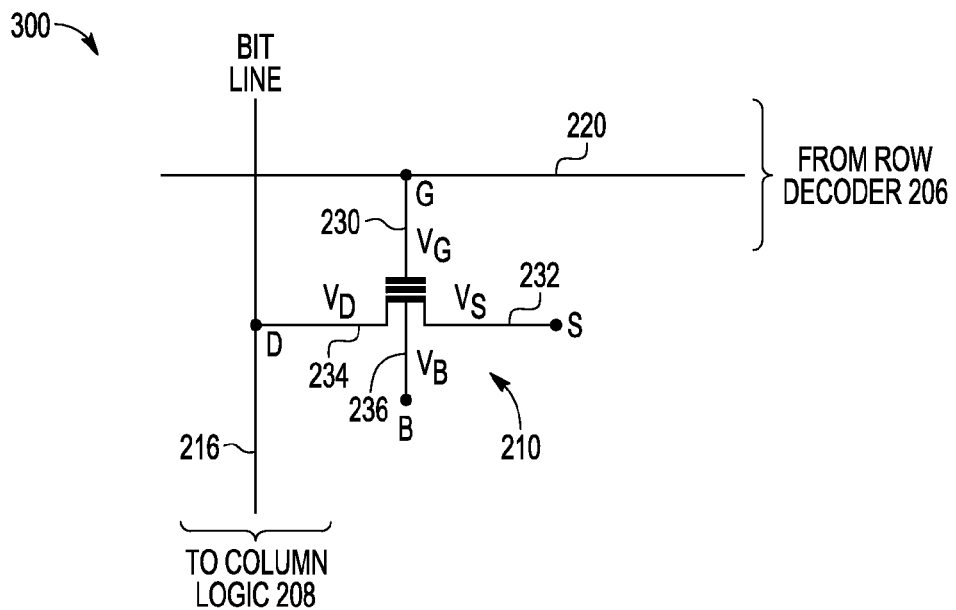
FIG. 3 is a diagram for wordline and bit-line connections to an NVM memory cell.

First, looking to FIGS. 1-3, example embodiments are described for adjusting bias conditions for NVM cells to improve read/verify performance and product lifetime of NVM systems. These embodiments use current NVM performance information, stored performance degradation information, and/or stored read/verify bias condition information to implement adjustments to NVM cell bias conditions for memory operations in order to improve read and verify read performance of the NVM system. It is further noted that verify operations (e.g., erase verify, soft-program verify, program verify) are a type of read operation and verify performance is also be improved as described herein.

FIG. 1 is a block diagram of an embodiment 100 including an non-volatile memory (NVM) system 102 along with additional circuitry, such as one or more processors 108 and a temperature sensor 112. The NVM system 102 is configured to store operational data that is utilized in operating the NVM system 102. For example, for the embodiment 100 depicted, the NVM system 102 includes performance degradation information 130 and/or read/verify bias condition information 132 that can be used for memory operations within the NVM system 102, as described in further detail below. This performance degradation information 130 and read/verify bias condition information 132 can be stored within storage circuitry located within the NVM system 102, and this storage circuitry can be, for example, random access memory (RAM), read-only memory (ROM), programmable non-volatile memory (NVM), or other desired storage circuitry. Still further, for the embodiment 100 depicted, the NVM system 102 and the processor(s) 108 are coupled to a communication bus 120 through connections 106 and 110, respectively. Additional circuitry blocks can also be included within the embodiment 100, as desired. For example, an on-chip temperature sensor 112 can be provided, and the temperature sensor 112 can be coupled to communication bus 120 through connections 114. The temperature sensor 112 can generate temperature measurements corresponding to the operating temperature for the NVM system 102. These temperature measurements can be accessed by or communicated to the processor(s) 108, the NVM system 102, and/or other circuitry, as desired. It is noted that the NVM system 102 can be integrated within a single integrated circuit with the one or more processors 108 or can be implemented as stand-alone memory integrated circuit, if desired. Further, it is noted that the temperature sensor 112 could be integrated with the NVM system 102 or could be integrated within another integrated circuit, if desired. Still further, it is noted that the circuitry for the NVM system 102 could be implemented using multiple integrated circuits, if desired.

The NVM system 102 includes an array 204 of NVM cells 202. The NVM system 102 also includes an NVM controller 212, a row decoder 206 and column decoder logic 208. As indicated above, the NVM system 102 is configured to store operational data, such as performance degradation information 130 and/or read/verify bias condition information 132, that can be used for one or more operations of the NVM system 102. Memory cell 210 represents one of the plurality of NVM memory cells 202. For the embodiment depicted, memory cell 210 is a floating-gate type NVM memory cell having a gate (G) connection 230, a source (S) connection 232, a drain (D) connection 234 and a body (B) connection 236. It is noted that other NVM cell types could also be utilized, if desired. For example, split-gate NVM cells or multi-level NVM cells could be used, or other NVM cells could be used, if desired.

The performance degradation information 130, as described herein, is used to determine when the NVM system 102 is experiencing degraded performance, for example, due to temperature variations, due to high cycle counts (e.g., due to long term use), due to longer pulse counts being required for program or erase operations, and/or due to other detected operational events for the NVM system 102. As described further below, once performance degradation has been detected, the controller 212 can change the read and/or verify bias conditions from a current set of bias conditions (e.g., default bias conditions) to a new set of bias conditions selected from the read/verify bias condition information 132 in order to improve product performance and extend product lifetime.

The stored read/verify bias condition information 132, as described herein, is used to provide different sets of selectable bias condition parameters for operating the NVM system 102. These sets of selectable bias condition parameters can include, for example, default bias conditions and one or more additional sets of bias conditions that can be selected based upon operating conditions, such as after detection of degraded performance or some other condition or parameter, as desired.

During operation, the NVM controller 212 provides row addresses to the row decoder 206 through connection 218. The row decoder 206 drives selected wordlines with gate bias voltages ($V_G$) 220 applied to gate nodes 230 for selected row(s) of NVM cells 202 within the NVM cell array 204. The NVM controller 212 also provides column addresses to column logic 208 through connections 214. The column logic 208 drives selected bit-lines with drain bias voltages ($V_D$) 216 applied to drain nodes 234 for selected column(s) of NVM cells 202. The column logic 208 is also used to access and read stored data values from the selected NVM cells 202 within the NVM cell array 204 through connections 216.

A bias voltage generator 150 is configured to generate a variety of bias voltages that are used for the operation of the NVM system 102. For example, the bias voltage generator 150 provides gate bias voltages 151 to row decoder 206 that are used to apply the gate bias voltages ($V_G$) 220 to the NVM cells 202 within the NVM cell array 204. The bias voltage generator 150 also provides drain bias voltages 152 to column logic 208 that are used to apply the drain bias voltages ($V_D$) 216 to the NVM cells 202 within the NVM cell array 204. Further, the bias voltage generator 150 provides body bias voltages ($V_B$) 222 to body nodes 236 for the NVM cells 202 within the NVM cell array 204, and the bias voltage generator 150 provides source bias voltages ($V_S$) 224 to source nodes 232 for the NVM cells 202 within the NVM cell array 204. The bias voltage generator 150 receives bias control signals 155 from the NVM controller 212 that control which bias voltages are provided by the bias voltage generator and used by the row decoder 206, the column logic 208, and the NVM cell array 204. It is further noted that the bias voltage generator 150 can be implemented as bias voltage generator circuitry that is distributed in different locations throughout the NVM system 102, if desired. For example, where the NVM system 102 is integrated within an integrated circuit, the bias voltage generator circuitry can be implemented as different circuit blocks positioned in different locations within the integrated circuit, and the different circuit blocks can be configured to generate one or more of the bias voltages. Further, if desired, the bias voltage generator circuitry can be implemented as a single, non-distributed circuit block. Other variations could also be implemented as desired while still provide the bias voltages described herein.

As indicated above, the NVM system 102 is configured to perform one or more operations, such as a read operation, an erase operation, a program operation, a soft-program operation, an erase verify operation, a program verify operation, a soft-program verify operation, and/or any other desired operation. Typically, when put into operation after manufacture, an erase operation is first performed to clear any information stored within the NVM system 102. Following an erase operation, a soft-program operation can be used to make sure that the erased NVM cells are not excessively depleted. Next, a program operation is performed to access selected NVM cells and to write desired data into the NVM system 102. Subsequently, read operations are used to access the data stored within the NVM system 102. If it is desired to modify the data stored in the NVM system 102, additional erase and program operations can be used to modify the data within the NVM system 102. Program/erase cycling and read operations are often continued throughout the useful life of the NVM system 102.

For a read operation, the data from the accessed NVM cells 202 is read by the column logic 208 and transmitted back to the NVM controller 212 through connections 214. The NVM controller 212 can then provide this read data to external circuitry through connections 106. For a program operation, the accessed memory cells are programmed with data provided by the NVM controller 212, which can in turn be provided from external circuitry through the connections 106. For an erase operation, the threshold voltage of the accessed memory cells is reduced to below a desired threshold (i.e., erase verify level) after the erase operation. For a soft-program operation, as indicated above, the threshold voltage of the accessed memory cells is increased to above a desired threshold (i.e., soft program verify level) after the soft program operation. Verify operations (e.g., erase verify, program verify, soft-program verify) are a type of read operation where the stored charge within NVM cells is interrogated by accessing the cells and compared against selected threshold voltages or currents.

It is further noted that for program and erase operations, charge is added to or removed from charge storage layers within the NVM cells 202. These charge storage layers can be, for example, floating gates or discrete charge layers within the NVM cells 202. More particularly, when an NVM cell 202 is programmed, electrons are added to the charge storage layer (e.g., thereby generating a higher threshold voltage when read). When the NVM cell 202 is erased, electrons are removed from the charge storage layer (e.g., thereby generating a lower threshold voltage when read). If desired, the NVM system 102 can be configured to operate with a weaker erase, such that after erase, a small negative charge is still left in the charge storage layer. Also, the NVM system 102 may be configured to have a very strong erase, such that the charge storage layer is over-erased, generating net holes within the storage layer and thereby providing a positive charge within the erased cell. When an NVM cell 202 is later accessed during a read operation, a determination is made as to whether the threshold voltage of the cell is greater than a read voltage level (e.g., logic "0") or less than a read voltage level (e.g., logic "1"). It is also noted that where multi-level NVM cells are utilized within the NVM system, a determination is made as to what logic values the threshold voltage of the cell represents. For example, for a four level cell, the detected logic levels are "00," "01," "10," and "11" with a single cell storing two bits of information.

FIG. 2 is a flow diagram of an embodiment 250 for adjusting operating bias conditions for the NVM system 102 when performance degradation has been detected. In block 260, current NVM performance information is obtained. This performance information can include operating temperature measurements, a count of the number of program/erase cycles the NVM system 102 has experienced (i.e., cycle count), a count of the number of pulses required for a successful erase or program operation (i.e., pulse count), and/or other desired performance information for the NVM system 102. A successful erase or program operation is typically considered to have occurred when all erased or programmed NVM cells satisfy erase verify, soft-program verify, and program verify voltage levels. Next, in block 261 performance degradation information is accessed for operations of the NVM system. This performance degradation information can include selected information used to determine when degradation has occurred or may occur associated with operations for the NVM system 102. As indicated above, the performance degradation information can include temperature information, cycle count information, erase or program pulse count information, interim program/erase verify information, and/or any other desired performance degradation information.

Determination block 262 then compares the current NVM performance information with the performance degradation information to make a determination of whether or not the performance of the NVM system 102 is degraded. If NO, then flow passes to block 268 where the next NVM operation is performed. If YES, then flow passes to block 264, where the read/verify bias condition information is accessed. As indicated above, the read/verify bias condition information can include different sets of read/verify bias condition parameters that may be used for performing NVM operations. These different sets of read/verify bias condition parameters can include, for example, a set of default read/verify bias conditions and one or more sets of additional read/verify bias conditions. The sets of additional read/verify bias conditions can provide bias conditions configured to respond to performance degradation determinations, thereby improving performance of the NVM system 102. In block 266, bias conditions are selected from the read/verify bias conditions information, and these selected bias conditions are applied to the NVM system 102. Finally, in block 268, the next NVM operation is performed using the newly selected and applied bias conditions. It is noted that where a set of default bias conditions and a single set of additional bias conditions are utilized, blocks 264 and 266 can be simplified such that the bias condition parameters being adjusted are simply switched from the default to the non-default bias conditions when performance degradation has been detected.

It is again noted that NVM system 102 is typically configured to perform one or more operations, such as a read operation, an erase operation, a program operation, a soft-program operation, an erase verify operation, a program verify operation, a soft-program verify operation and/or any other desired operation. During these operations, bias conditions are applied to the NVM cells 202 within the NVM system 102, and these bias conditions depend upon the NVM operation being performed.

FIG. 3 is a diagram of an embodiment 300 for wordline and bit-line connections to an NVM memory cell 210. During an operation, the NVM memory cell 210 has its body (B) 236 connected to a body bias voltage ($V_B$) and has its source (S) 232 connect to a source bias voltage ($V_S$), for example, as provided by the bias voltage generator 150 as described above. The NVM cell 210 has its drain (D) 234 coupled to the column logic 208 through one of the connections 216 to receive a drain bias voltage ($V_D$). The NVM cell 210 has its gate (G) 230 coupled to the row decoder 206 through one of the connections 220 to receive a gate bias voltage ($V_G$). Depending upon the operation to be performed for the NVM memory cells 202, different body, source, drain, and gate bias voltages ($V_B$, $V_S$, $V_D$, $V_G$) are applied to the body (B) nodes 236, source (S) nodes 232, drain (D) nodes 234, and gate (G) nodes 230 for selected NVM memory cells 202.

TABLE 1 below provides example default bias conditions that can be used for read operations, program verify operations, erase verify operations and soft-program verify operations for the NVM system 102. TABLE 1 also provides example adjustments that can be made to the gate node voltage ($V_G$) for different NVM operations when performance degradation has been detected. It is noted that other bias conditions in addition to or instead of the gate node voltage ($V_G$) could also be adjusted, if desired. For example, the gate node voltage ($V_G$), the drain node bias voltage ($V_D$), the source node bias voltage ($V_S$), the body node bias voltage ($V_B$) or any combination thereof could be adjusted to improve performance after detection of a performance degradation condition for the NVM system 102.

TABLE 1

EXAMPLE DEFAULT BIAS CONDITIONS AND
ADJUSTMENTS FOR IMPROVED PERFORMANCE

| Operation | $V_D$ (volts) | $V_G$ (volts) | $V_S$ (volts) | $V_B$ (volts) | $V_G$ (volts) Adjustments |
|---|---|---|---|---|---|
| Read | 0.5 | 4.5 | GND | GND | ±500 millivolts |
| Program Verify | 0.5 | 6.0 | GND | GND | ±500 millivolts |
| Soft-program Verify | 0.5 | 2.0 | GND | GND | ±500 millivolts |
| Erase Verify | 0.5 | 3.5 | GND | GND | ±500 millivolts |

With respect to TABLE 1, it is noted that "±500 millivolts" refers to an adjustment that can be in a range from zero to positive 500 millivolts or from zero to negative 500 millivolts, as desired. The magnitude and sign of a particular adjustment value can be selected, as desired, and different adjustments can be selected for different sets of bias conditions. It is also noted that for read operations, the bit-line voltage is initially set to an initial voltage, such as 0.5 volts, and then allowed to change based upon the charge stored in the accessed NVM memory cell. The voltage on the bit-line will then indicate the logic value associated with the stored charge within the selected NVM cell. It is again noted that verify operations are a type of read operation where the charge stored in the NVM cells is read and compared to a desired voltage level to verify proper operation of erase, soft-program, and program operations. Still further, it is noted that ground (GND), as set forth in the table below, can be configured to be zero volts.

Figure 4:
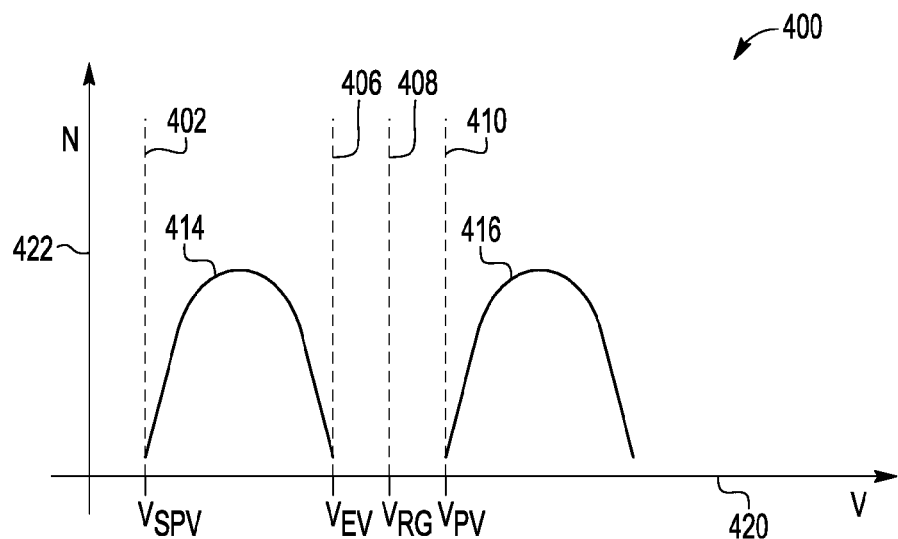
FIG. 4 is a probability distribution diagram for threshold voltages of the NVM cells with respect to programming and erase operations.

Performance degradation affects for the NVM cells 202 within the NVM system 102 are now discussed in more detail with respect to FIG. 4.

FIG. 4 is a probability distribution diagram 400 for the gate or threshold voltages of the NVM cells with respect to programming and erase operations. The x-axis 420 represents threshold voltage, and the y-axis 422 represents a probability distribution (N) of threshold voltage levels for NVM cells 202 within the NVM cell array 204. The voltage level 408 represents a read gate bias voltage ($V_{RG}$) applied during read operations. With respect to verification operations, the voltage level 402 represents a soft-program verify voltage ($V_{SPV}$) used during soft-program verification operations. The voltage level 406 represents an erase verify bias voltage ($V_{EV}$) used during erase verification operations. The voltage level 410 represents a program verify bias voltage ($V_{PV}$) used during program verification operations. Curve 414 represents a probability distribution for threshold voltages of erased cells within the NVM cell array 204. Curve 416 represents a probability curve for threshold voltages of programmed cells within the NVM cell array 204. For read operations, if the threshold voltage level of the accessed cell is above the read gate bias voltage ($V_{RG}$) 408, the NVM cell is determined to be programmed (e.g., logic 0). If the threshold voltage level of the accessed cell is below the read gate bias voltage ($V_{RG}$) 408, the NVM cell is determined to be erased (e.g., logic 1).

It is noted that FIG. 4 illustrates an example where two-level memory cells are utilized. Multi-level cells (MLCs) could also be used, such that there would be four or more distribution curves, depending upon the number of voltage levels utilized.

According to the embodiments described herein, it is recognized that temperature, cycle count, and/or other operational factors can affect the voltage probability distribution curves for the NVM cells. For example, the probability curves depicted in FIG. 4 will shift over time depending upon the operating temperature of the NVM system 102 and depending upon the number of times the NVM cells have been programmed and erased (i.e., cycle count). For example, after a given number of program pulses at a given operating temperature, the program distribution curve 416 will shift left for NVM cells with higher cycle count as compared to those with lower cycle count. Further, after a given number of erase pulses at a given operating temperature, the erase distribution curve 414 will shift right for NVM cells with higher cycle count compare with those with lower cycle count.

It is noted that one degradation affect caused by high cycle counts, as indicated above, is that program and erase operations can require additional time. For example, for a relatively young NVM system 102 (e.g., one that has a relatively low cycle count), an erase operation may require between 20-25 erase pulses before all erased NVM cells have threshold voltage lower than the erase verify voltage ($V_{EV}$) 406. For an aged NVM system 102 (e.g., one that has a relatively high cycle count), where the number of program/erase cycles has led to degraded performance, 32 or more erase pulses may be required before all erased NVM cells have a threshold voltage lower than the erase verify voltage ($V_{EV}$) 406. Similarly, for a relatively young NVM system 102, a program operation may require between 1-3 program pulses before all programmed NVM cells have a threshold voltage higher than the program verify voltage ($V_{PV}$) 416. For an aged NVM system 102, where the number of cycles has led to degraded performance, 5 or more program pulses may be required before all programmed NVM cells have a threshold voltage higher than the program verify voltage ($V_{PV}$) 416.

Advantageously, the embodiments described herein provide for adjustments to the read and/or verify operating bias conditions for the NVM cells 202 to reduce performance degradations that would otherwise occur, for example, from temperature variations, from high cycling counts, and/or from other factors.

Figure 5:
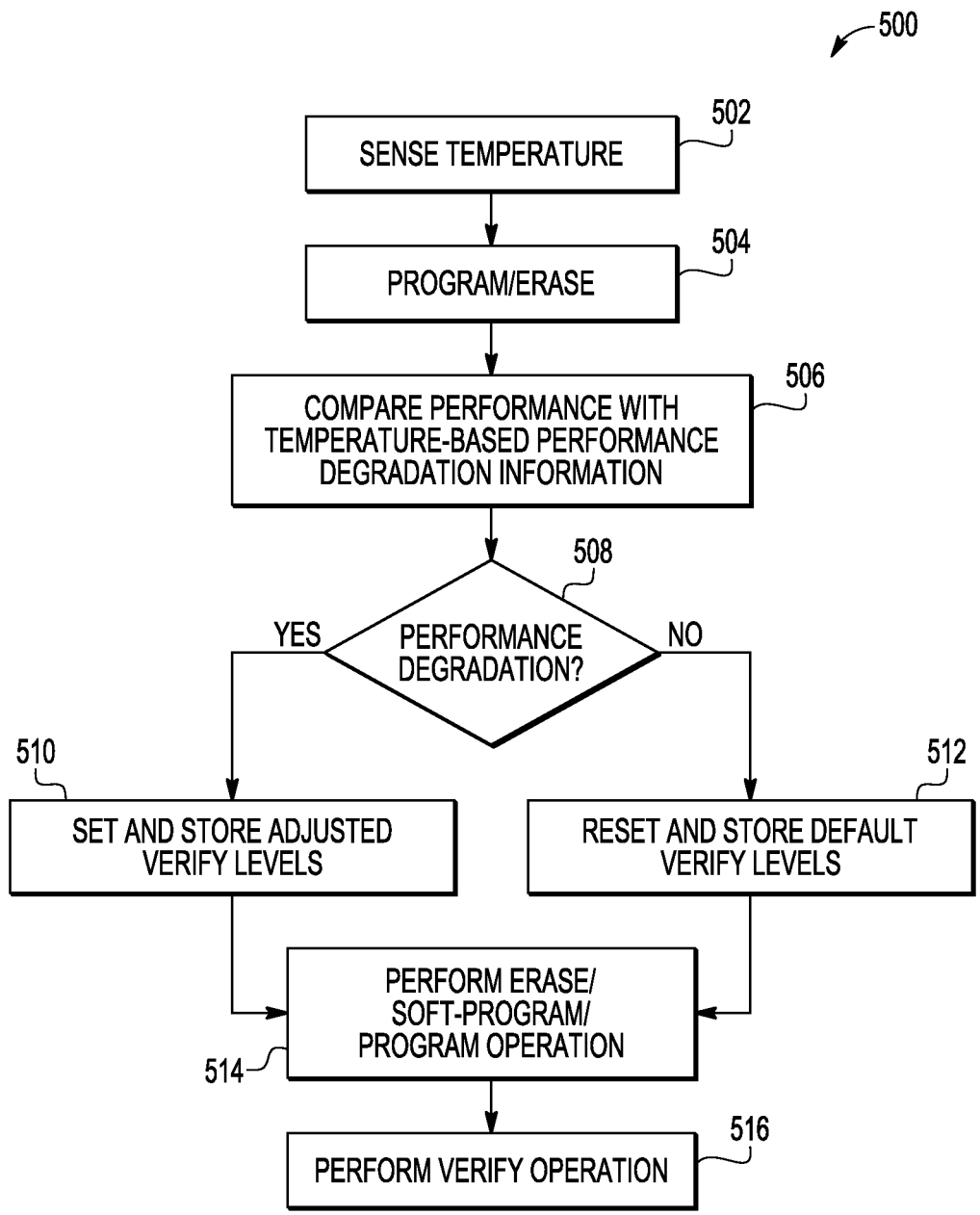
FIG. 5 is a flow diagram of an embodiment for adjusting program verify and/or soft-program verify bias conditions for NVM cells based upon temperature-based performance data for the NVM.
Figure 6:
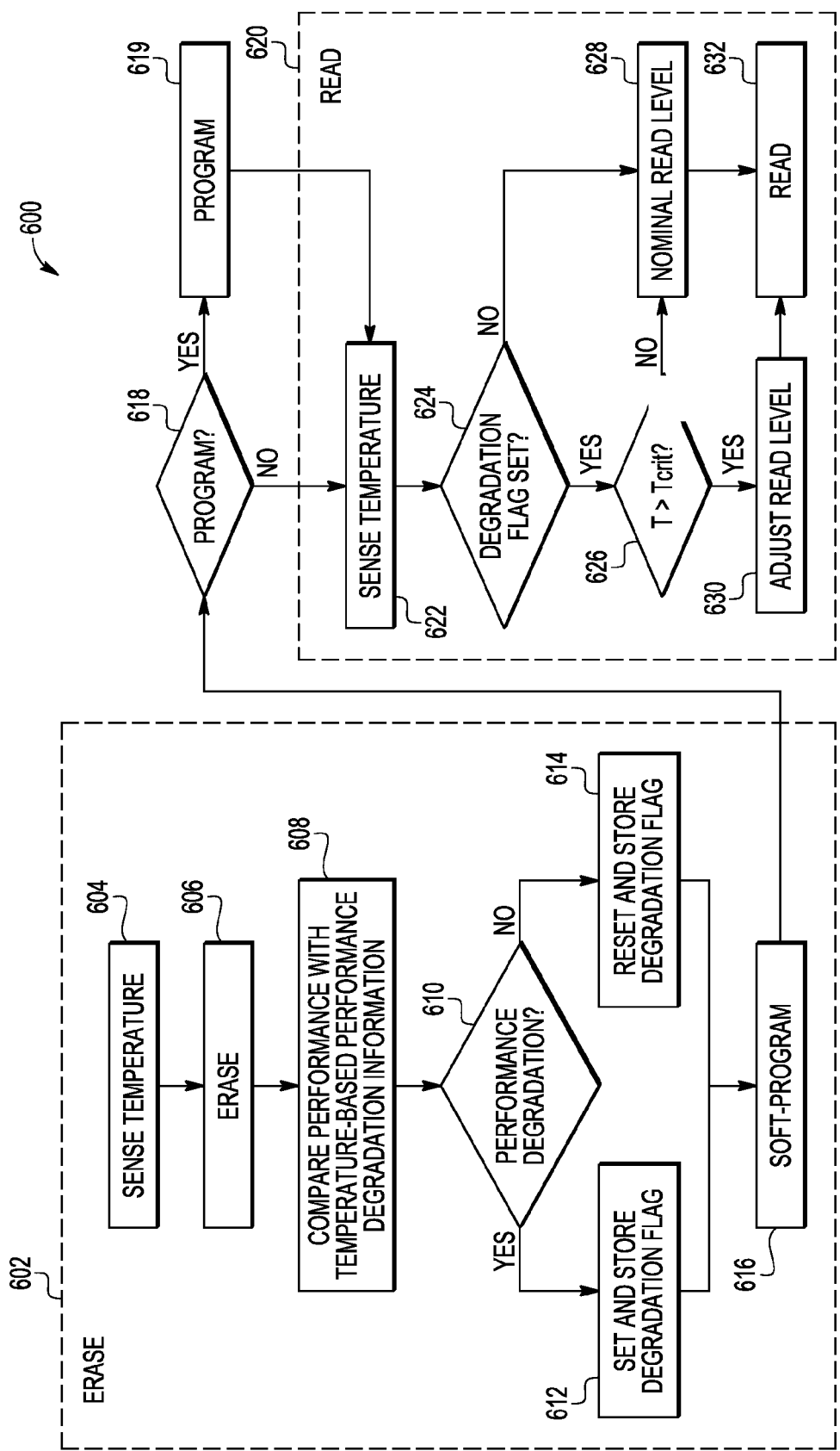
FIG. 6 is a flow diagram of an embodiment for adjusting read bias conditions for NVM cells based upon temperature-based performance data for the NVM.

Additional embodiments will now be described in more detail with respect to FIGS. 5-6 along with TABLES 2-3 below. In particular, FIGS. 5-6 provide embodiments that modify NVM cell bias conditions for read/verify operations based upon performance degradation determinations. With respect to TABLES 2-3 below, it is further noted that bias conditions could also be adjusted for additional memory operations other than those set forth within the tables, and bias conditions in addition to or instead of the gate node voltage ($V_G$) could also be adjusted, if desired. For example, the gate node voltage ($V_G$), the drain node bias voltage ($V_D$), the source node bias voltage ($V_S$), the body node bias voltage ($V_B$) or any combination thereof could be adjusted to improve performance for selected memory operations for the NVM system 102.

FIG. 5 is a flow diagram of an embodiment 500 for adjusting erase verify, program verify, and/or soft-program verify operating bias conditions for the NVM based upon temperature-based performance data for the NVM. In particular, the example embodiment 500 of FIG. 5 provides dynamically determined verify voltages based on cycling performance and temperature. By optimizing the verify voltage levels dynamically to compensate for de-trapping effects, verify margin is improved, even where massive trap-up effects have occurred, for example, due to high cycle counts.

For the embodiment 500 depicted, operating temperature is sensed for the NVM system 102 in block 502. In block 504, a program, and/or erase operation is performed for the NVM system 102. In block 506, performance of the NVM cells 202 are compared against performance degradation information, such as temperature-based performance degradation information. In block 508, a determination is made whether performance degradation has occurred. If YES, the verify voltage levels for selected verify operations (e.g., soft-program verify, program verify, erase verify) are adjusted and stored in block 510. If NO, the verify voltage levels are reset and default conditions are stored in block 512. From block 510 or from block 512, block 514 is then reached where an erase, soft-program, and/or program operation is performed. Block 516 is then reached where a verify operation is performed (e.g., erase verify, soft-program verify, program verify).

TABLE 2 below provides example adjustments that can be used to adjust the operating bias conditions for erase verify, soft-program verify, and program verify operations based upon performance measurements. For example, temperature-based performance data can be stored as performance degradation information 130 within the NVM system 102. Further, verify bias condition can be stored as read/verify bias condition information 132 within the NVM system 102. These verify bias conditions, for example, can be stored in the form of a look-up table, if desired, that identifies verify bias conditions or parameters to use depending upon the performance measurement. Further, this data can be updated, stored, and restored, as desired.

TABLE 2

VERIFY VOLTAGE LEVEL ADJUSTMENTS
FOR PERFORMANCE DEGRADATION

| Operation | $V_D$ (volts) | $V_G$ (volts) | $V_S$ (volts) | $V_B$ (volts) |
|---|---|---|---|---|
| Program Verify | 0.5 | 6.0 Volts ± 500 millivolts | GND | GND |
| Soft-program Verify | 0.5 | 2.0 Volts ± 500 millivolts | GND | GND |
| Erase Verify | 0.5 | 3.5 Volts ± 500 millivolts | GND | GND |

As shown in embodiment 500 and described in TABLE 2, therefore, the operating temperature is checked before program/erase cycling using a temperature sensor measurement. After program/erase cycling, a cycling performance determination is made, for example, based upon program pulse count (PPT) and/or erase pulse count (EPT) for the measured operation temperature. If cycling performance falls outside a pre-set level (e.g., EPT/PPT exceeds pre-set number for measured temperature), it is assumed that the de-trapping effect will be large enough such that a verify bias voltage adjustment will be needed. The program verify voltage level, the erase verify voltage level, the soft-program verify voltage level or a combination of program/erase/soft-program verify voltage levels are then increased for the following program/erase cycling operations. By doing so, more margin is gained for a correct verify results. As described above, the threshold voltage (Vt) for both erased bits and programmed bits will shift after high cycle counts due to the de-trapping and other effects. Thus, adjusting the verify voltage levels after performance degradation gives more margin, thereby maintaining high performance and reliability for longer times.

FIG. 6 is a flow diagram of an embodiment 600 for adjusting read operating bias conditions for the NVM based upon performance data for the NVM, such as temperature-based performance data. In particular, the example embodiment 600 of FIG. 6 provides a dynamically determined read bias voltage scheme based on cycling performance and temperature. By optimizing the read bias voltages dynamically, read margin is improved, even where massive trap-up effects have occurred, for example, due to high cycle counts. For the embodiment 600 depicted, a degradation determination is made as part of the erase steps 602. The read bias conditions are then adjusted within the read process steps 620, depending upon the degradation determination. Degradation flags are used to identify whether or not degradation has occurred such that the read bias conditions will be adjusted.

For the erase process steps 602 depicted in embodiment 600, the process flow starts in block 604 where the on-chip operating temperature is sensed. In block 606, an erase operation is performed for the NVM system 102. In block 608, erase performance of the NVM cells 202 are compared against temperature-based performance degradation information. In block 610, a determination is made whether performance degradation has occurred. If YES, then a degradation flag is set to be TRUE (e.g., indicating degradation has occurred) and stored in block 612. If NO, the degradation flag is reset to FALSE (e.g., indicating degradation is not present) and stored in block 614. From block 612 or from block 614, block 616 is then reached where a soft-program operation is performed.

Once the erase process steps 602 have been completed, block 618 is reached where a determination is made whether or not a program operation is to be performed. If NO, then the read process steps 620 are reached. If YES, a program operation is performed in block 619, and then the read process steps 620 are reached.

For the read process steps 620, a temperature is sensed in block 622. Next, in step 624 a determination is made whether or not the degradation flag has been set to TRUE. If NO, then block 628 is reached where the read voltage level is set to a nominal or default read voltage level, and then block 632 is reached where a read operation is performed using this nominal read voltage level. If the determination in block 610 is YES, block 626 is reached where a determination is made whether the sensed temperature (T) is greater than a critical temperature value ($T_{CRIT}$). The critical temperature value ($T_{CRIT}$) is selected to indicate when erase performance degradation can be expected to affect read performance using nominal read voltage levels. If the determination in block 626 is NO, then block 628 is again reached where the read voltage level is set to a nominal or default read voltage level, and then block 632 is reached where a read operation is performed using this nominal read voltage level. If the determination in block 626 is YES, then block 630 is reached where the read voltage level is set to an adjusted read voltage level, and then block 632 is reached where a read operation is performed using this adjusted read voltage level.

TABLE 3 below provides example adjustments that can be used to adjust the operating bias conditions for read operations based upon the performance measurements. For example, temperature-based performance data can be stored as performance degradation information 130 within the NVM system 102. Further, read bias condition can be stored as read/verify bias condition information 132 within the NVM system 102. These read bias conditions, for example, can be stored in the form of a look-up table, if desired, that identifies read bias conditions or parameters to use depending upon the performance measurement. Further, this data can be updated, stored, and restored, as desired.

TABLE 3

READ VOLTAGE LEVEL ADJUSTMENTS
FOR PERFORMANCE DEGRADATION

| Operation | $V_D$ (volts) | $V_G$ (volts) | $V_S$ (volts) | $V_B$ (volts) |
|---|---|---|---|---|
| Read | 0.5 | 4.5 Volts ± 500 millivolts | GND | GND |

As shown for embodiment 600 and described in TABLES 3, therefore, NVM cycling performance is checked against pre-set criteria after each cycle. For example, erase pulse count (EPT) can be used to determine cycle performance, where EPT is the number of pulses required for all cells to satisfy the erase verify requirements (e.g., voltage less than erase verify voltage). Program pulse count (PPT) can also be used to determine cycle performance, where PPT is the number of pulses required for all cells to satisfy the program verify requirements (e.g., voltage greater than program verify voltage). If cycling performance exceeds the pre-set level, the operating temperature is then checked through a temperature sensor measurement. If the temperature is above a critical temperature ($T_{CRIT}$) threshold (e.g., greater than 85° C.), it is assumed that the de-trapping effect will be large enough such that a read bias voltage adjustment will be needed. The read voltage is then adjusted (e.g., lowered by 0.2 volts) for the following read operation. However, the read reference current is kept at the same default value. By doing so, more margin is gained for a correct read result. As described above, the threshold voltage (Vt) for both erased bits and programmed bits will shift after high cycle counts due to the de-trapping effect. Thus, adjusting the read bias voltages at high temperatures and after performance degradation gives more margin, thereby maintaining high performance and reliability for longer times.

As indicated herein, a variety of embodiments can be implemented and different features and variations can be implemented, as desired.

In one system embodiment, an integrated non-volatile memory (NVM) system includes an array of non-volatile memory (NVM) cells, bias voltage generator circuitry configured to generate bias voltages for the NVM cells, and controller circuitry configured to determine performance degradation for the NVM system based upon performance information relating to at least one of a program operation or an erase operation and to adjust at least one voltage level for the bias voltages generated by the bias voltage generator circuitry based upon the performance degradation determination. The controller circuitry is further configured to conduct at least one of a read operation or a verify operation for the NVM system using the at least one adjusted voltage level. In further embodiments, the performance information includes at least one of cycle count, program pulse count, or erase pulse count.

In additional system embodiments, the at least one voltage level includes a voltage level for a gate bias voltage for a read operation. Further, the gate bias voltage level can be increased by an amount less than or equal to 500 millivolts. The at least one voltage level can also include a voltage level for a gate bias voltage for a verify operation. Further, the gate bias voltage level can be increased by an amount less than or equal to 500 millivolts.

In further system embodiments, the bias voltage generator circuitry can include at least two circuit blocks positioned in different locations on the integrated NVM system. Still further, the controller circuitry can be further configured to obtain operating temperature information for the NVM system and to use the operating temperature information for the performance degradation determination. In addition, the system can further include storage circuitry configured to store sets of bias condition parameters, and the controller circuitry can be further configured to use at least one set of stored bias condition parameters to adjust the at least one voltage level. Further, the system can further include storage circuitry configured to store performance degradation information, and the controller circuitry can be configured to compare the performance information to stored performance degradation information to make the performance degradation determination.

In still further system embodiments, the controller circuitry can be configured to set a degradation flag to indicate whether or not a performance degradation condition exists for the NVM system. In addition, the controller circuitry can be configured to adjust that at least one voltage level from a default value to a non-default value if the degradation flag indicates that performance degradation does exist. Further, the controller circuitry can be further configured to obtain operating temperature information for the NVM system, and the controller circuitry can be further configured to adjust the at least one voltage level only if the operating temperature exceeds a threshold temperature level.

In one method embodiment, a method for operating an integrated non-volatile memory (NVM) system includes determining performance degradation based upon performance information relating to at least one of a program operation or an erase operation for an array of non-volatile memory (NVM) cells within an NVM system, adjusting at least one bias voltage for the NVM cells based upon the performance degradation determination, and performing at least one of a read operation or a verify operation for the NVM system using the adjusted at least one bias voltage. In further embodiments, the performance information for the determining step can include at least one of cycle count, program pulse count or erase pulse count.

In additional method embodiments, the method can further include obtaining operating temperature information for the NVM system, and the determining step can compare the performance information with temperature-based performance degradation information associated with at least one of program pulse counts, erase pulse counts, or cycle counts. Still further, the adjusting step can include increasing a voltage level for a gate bias voltage. In addition, the voltage level can be increased by an amount less than or equal to 500 millivolts.

In further method embodiments, the method can include setting a degradation flag to indicate whether or not a performance degradation condition exists for the NVM system after the determining step. Still further, method can include adjusting the at least one voltage level from a default value to a non-default value if the degradation flag indicates that performance degradation does exist.

Unless stated otherwise, terms such as "first" and "second" are used to arbitrarily distinguish between the elements such terms describe. Thus, these terms are not necessarily intended to indicate temporal or other prioritization of such elements.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the invention is described herein with reference to specific embodiments, various modifications and changes can be made without departing from the scope of the present invention. Accordingly, the specification and figures are to be regarded in an illustrative rather than a restrictive sense, and such modifications are intended to be included within the scope of the present invention. Further, any benefits, advantages, or solutions to problems that are described herein with regard to specific embodiments are not intended to be construed as a critical, required, or essential feature or element of any or all the claims.

What is claimed is:

1. An integrated non-volatile memory (NVM) system, comprising:
   an array of non-volatile memory (NVM) cells;
   bias voltage generator circuitry configured to generate bias voltages for the NVM cells;
   storage circuitry configured to store pulse count performance degradation information, the pulse count performance degradation information being at least one of a program pulse count number for a program operation or an erase pulse count number for an erase operation; and
   controller circuitry configured to determine pulse count performance information relating to at least one of a number of program pulses required for a program operation or a number of erase pulses required for an erase operation, to compare the pulse count performance information to the stored pulse count performance degradation information to determine performance degradation, and to adjust at least one voltage level for the bias voltages generated by the bias voltage generator circuitry for read or verify operations based upon the performance degradation determination;
   wherein the controller circuitry is further configured to conduct at least one of a read operation or a verify operation for the NVM system using the at least one adjusted voltage level.

2. The integrated NVM system of claim 1, wherein the at least one voltage level comprises a voltage level for a gate bias voltage for a read operation.

3. The integrated NVM system of claim 2, wherein the gate bias voltage level is increased by an amount less than or equal to 500 millivolts.

4. The integrated NVM system of claim 1, wherein the at least one voltage level comprises a voltage level for a gate bias voltage for a verify operation.

5. The integrated NVM system of claim 4, wherein the gate bias voltage level is increased by an amount less than or equal to 500 millivolts.

6. The integrated NVM system of claim 1, wherein the bias voltage generator circuitry comprises at least two circuit blocks positioned in different locations on the integrated NVM system.

7. The integrated NVM system of claim 1, wherein the pulse count performance degradation information comprises temperature-based program pulse count numbers or temperature-based erase pulse count numbers, and wherein the controller circuitry is further configured to obtain operating temperature information for the NVM system and to use the operating temperature information for the performance degradation determination.

8. The integrated NVM system of claim 1, wherein the storage circuitry is further configured to store sets of bias condition parameters, and wherein the controller circuitry is configured to use at least one set of stored bias condition parameters to adjust the at least one voltage level.

9. The integrated NVM system of claim 1, wherein the controller circuitry is configured to set a degradation flag to indicate whether or not a performance degradation condition exists for the NVM system and to use the degradation flag to determine whether to adjust the at least one voltage level.

10. The integrated NVM system of claim 9, wherein the controller circuitry is further configured to adjust that at least one voltage level from a default value to a non-default value if the degradation flag indicates that performance degradation does exist.

11. The integrated NVM system of claim 10, wherein the controller circuitry is further configured to obtain operating temperature information for the NVM system, and wherein the controller circuitry is further configured to adjust the at least one voltage level only if a threshold operating temperature level is exceeded.

12. A method for operating an integrated non-volatile memory (NVM) system, comprising:
    determining pulse count performance information relating to at least one of a number of program pulses required for a program operation or a number of erase pulses required for an erase operation for the array of non-volatile memory (NVM) cells within the NVM system;
    comparing the pulse count performance information to pulse count performance degradation information stored in storage circuitry for the NVM system to determine performance degradation, the pulse count performance degradation information being at least one of a program pulse count number for a program operation or an erase pulse count number for an erase operation;
    adjusting at least one bias voltage for the NVM cells for read or verify operations based upon the performance degradation determination; and
    performing at least one of a read operation or a verify operation for the NVM system using the adjusted at least one bias voltage.

13. The method of claim 12, further comprising obtaining operating temperature information for the NVM system, and wherein the determining step compares the pulse count performance information with temperature-based pulse count performance degradation information associated with at least one of temperature-based program pulse counts numbers or temperature-based erase pulse count numbers.

14. The method of claim 12, wherein the adjusting step comprises increasing a voltage level for a gate bias voltage.

15. The method of claim 12, wherein the voltage level is increased by an amount less than or equal to 500 millivolts.

16. The method of claim 12, further comprising setting a degradation flag to indicate whether or not a performance degradation condition exists for the NVM system after the determining step, and using the degradation flag to determine whether to perform the adjusting step.

17. The method of claim 16, further comprising adjusting the at least one bias voltage from a default value to a non-default value if the degradation flag indicates that performance degradation does exist.

18. The method of claim 17, wherein the at least one voltage level is adjusted only if a threshold operating temperature level is exceeded.

* * * * *